United States Patent
Itoh et al.

(10) Patent No.: US 7,252,881 B2
(45) Date of Patent: *Aug. 7, 2007

(54) MULTILAYER STRUCTURE AND MULTILAYER WIRING BOARD USING THE SAME

(75) Inventors: Takashi Itoh, Shiga (JP); Shoji Hara, Kanagawa (JP); Hirosaku Nagano, Shiga (JP); Masaru Nishinaka, Shiga (JP)

(73) Assignee: Kaneka Corporation, Osaka (JP)

( * ) Notice: Subject to any disclaimer, the term of this patent is extended or adjusted under 35 U.S.C. 154(b) by 189 days.

This patent is subject to a terminal disclaimer.

(21) Appl. No.: 10/257,502

(22) PCT Filed: Apr. 12, 2001

(86) PCT No.: PCT/JP01/03175

§ 371 (c)(1),
(2), (4) Date: Oct. 10, 2002

(87) PCT Pub. No.: WO01/76866

PCT Pub. Date: Oct. 18, 2001

(65) Prior Publication Data

US 2003/0194573 A1    Oct. 16, 2003

(30) Foreign Application Priority Data

Jul. 26, 2000   (JP) .............................. 2000-224861

(51) Int. Cl.
 B32B 15/08 (2006.01)
 B32B 27/28 (2006.01)
 H05K 1/03 (2006.01)

(52) U.S. Cl. .................. 428/344; 174/258; 174/259; 428/354; 428/209; 428/355; 428/458; 428/473.5

(58) Field of Classification Search .......... 428/473.5, 428/411.1, 457, 458, 209, 214, 901, 344, 428/354, 355; 528/170, 353; 427/458; 264/272.17; 204/192.14; 174/258, 259
See application file for complete search history.

(56) References Cited

U.S. PATENT DOCUMENTS

| | | | | |
|---|---|---|---|---|
| 3,849,187 A | * | 11/1974 | Fetscher et al. | 257/786 |
| 5,621,068 A | * | 4/1997 | Okamoto et al. | 528/353 |
| 5,668,247 A | * | 9/1997 | Furutani et al. | 528/353 |
| 5,773,509 A | * | 6/1998 | Yoshida et al. | 524/600 |
| 6,335,416 B1 | * | 1/2002 | Nojiri et al. | 528/170 |
| 6,350,844 B1 | * | 2/2002 | Ono et al. | 528/170 |
| 6,586,081 B1 | * | 7/2003 | Nishinaka et al. | 428/209 |
| 6,693,162 B2 | * | 2/2004 | Tsuji et al. | 528/170 |
| 6,773,809 B1 | * | 8/2004 | Itoh et al. | 428/355 R |
| 6,838,184 B2 | * | 1/2005 | Takahashi et al. | 428/473.5 |
| 6,911,265 B2 | * | 6/2005 | Nishinaka et al. | 428/458 |
| 2003/0113521 A1 | * | 6/2003 | Nishinaka et al. | 428/209 |
| 2004/0231141 A1 | * | 11/2004 | Nishinaka et al. | 29/609 |
| 2005/0221080 A1 | * | 10/2005 | Nishinaka et al. | 428/332 |

FOREIGN PATENT DOCUMENTS

| | | |
|---|---|---|
| EP | 0 603 725 | 6/1994 |
| JP | 4-46983 | 2/1992 |
| JP | 7-62097 | 3/1995 |
| JP | 8-186376 | 7/1996 |
| JP | 11-148053 | 6/1999 |
| JP | 11-236448 | 8/1999 |

* cited by examiner

*Primary Examiner*—Ana Woodward
(74) *Attorney, Agent, or Firm*—Brinks Hofer Gilson & Lione (57) ABSTRACT

A multilayer structure comprising a conductor layer, an adhesive layer, and a polymer film layer interposed between the conductor layer and the adhesive layer. The multilayer structure can be used to provide a multilayer wiring board having excellent electrical properties and an excellent balance of physical properties, high heat resistance, a narrow pitch wiring pattern, a small-diameter via, uniform insulating layer thickness, an appropriately low coefficient of linear expansion, and stable adhesiveness between a metal and the polymer film. The polymer film layer may contain at least one repeating unit represented by formula (1) in the molecule. The present invention also provides a multilayer wiring board obtained from the multilayer structure.

26 Claims, 1 Drawing Sheet

FIG.1

MULTILAYER STRUCTURE AND MULTILAYER WIRING BOARD USING THE SAME

RELATED APPLICATIONS

This application is a nationalization of PCT application PCT/JP01/03175 filed Dec. 4, 2001. This application claims priority from the PCT application and Japan Application Serial No. 2000-110199 filed Dec. 4, 2000; Japan Application Serial No. 2000-224861 filed Jul. 26, 2000.

TECHNICAL FIELD

The present invention relates to a multilayer structure comprising a conductor layer, a polymer film and an adhesive layer. More particularly, the present invention relates to a multilayer structure having excellent electrical properties and an excellent balance of physical properties, which can provide a multilayer wiring board has a high heat resistance, a narrow pitch wiring pattern, a small-diameter via, an insulating layer having a uniform thickness, an appropriately low coefficient of linear expansion, and a stable adhesiveness between a metal and a polymer film.

BACKGROUND ART

As electronic devices become smaller-sized, higher-performance, and more sophisticated, there is a demand for a printed wiring board capable of providing a high density package. The high density package of the printed wiring board may be achieved by a multilayer wiring board, a thinner insulating layer, an inner via hole instead of a conventional through hole, a small via diameter, a narrower circuit pitch, and the like. A build-up multilayer printed wiring board producing technique is one of techniques for achieving the high density package of the printed wiring board.

Makers produce multilayer printed wiring boards by various build-up methods. Among them, a method, which employs copper foil with an insulating adhesive, is adopted by a number of makers because the material is easy to handle and a conductor layer is already formed and therefore processing steps can be significantly reduced.

The copper foil with an insulating adhesive has a two-layer structure including copper foil and an adhesive layer, which is generally produced by applying a liquid adhesive onto copper foil and drying the adhesive. For example, a general build-up multilayer wiring board using copper foil with an insulating adhesive is produced as follows (see FIG. 1).

Figure 1:
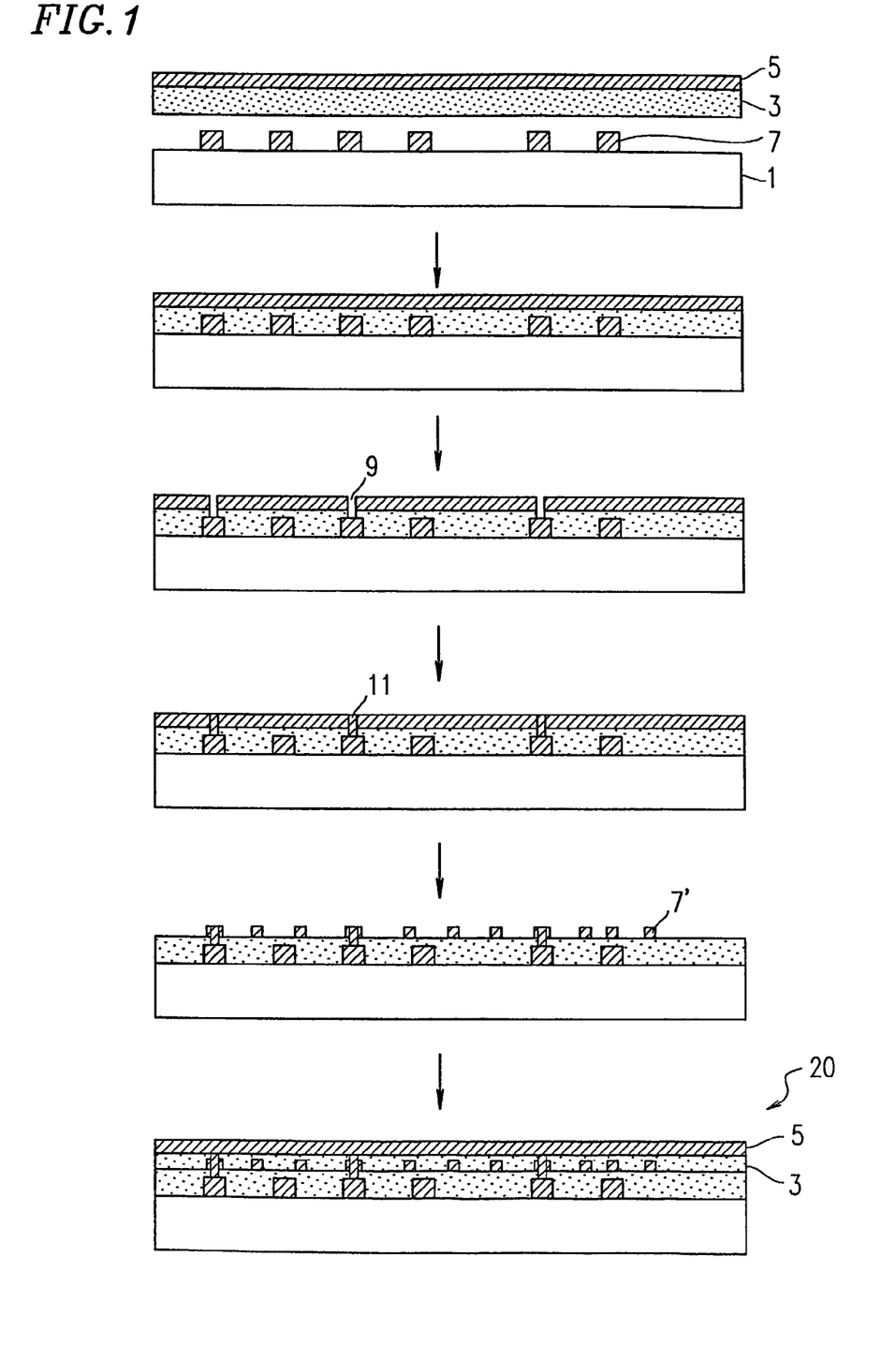
FIG. 1 is a schematic diagram of the production of a build-up multilayer wiring board.

Initially, a circuit 7 is formed in advance. Thereafter, copper foil 5 with an insulating adhesive 3 is laminated onto a copper-clad laminate 1 containing glass cloth provided with a through hole by presswork, roll lamination, or the like. Thereafter, a portion of the copper foil in which a via 9 is to be formed are removed by etching using a photosensitive resin, and the adhesive layer is removed by laser drilling, resulting in formation of the via 9. The formed via is made conductive by electroless plating 11. The thus-laminated copper foil is etched to form a circuit 7'.

Again, copper foil with an insulating adhesive is laminated onto the resultant circuit, and thereafter, similar steps to those described above are repeated, thereby producing a multilayer wiring board 20.

However, it is pointed out that as superior properties are required for a build-up multilayer wiring board, several problems arise when using conventional copper foil with an insulating adhesive. Specifically, i) when a narrow pitch circuit pattern is produced by etching, the smaller thickness of a conductor layer to be etched is advantageous in terms of yield, but since the copper foil of conventional copper foil with an insulating adhesive generally has a thickness of 18 µm, or at least 12 µm, there is a limit to the production of a narrow pitch circuit pattern; ii) when a small-diameter via is formed by laser drilling, a smaller aspect ratio, i.e., smaller thickness of the insulating layer, is advantageous, but when a smaller thickness of the insulating layer of conventional copper foil with an insulating adhesive makes it difficult to cause each of the laminated insulating layers to have a uniform thickness, and the insulation performance is reduced, thereby making it difficult to provide electrical reliability; and the like.

In particular, in a multilayer wiring board for which smaller size and lighter weight are required, a glass cloth-containing copper-clad laminate used as a core layer typically has a thickness of about 400 µm and a heavy weight due to the contained glass, and therefore is not a material suitable for reduction of size and weight.

If only copper foil with an insulating adhesive is used without using the glass cloth-containing copper-clad laminate to produce a build-up multilayer wiring board, it is possible to obtain one which has a smaller size and a lighter weight, but the resultant wiring board lacks rigidity, and also lacks package reliability due to a great coefficient of linear expansion derived from the insulating adhesive, and does not endure use.

Japanese Laid-Open Publication No. 8-186376 discloses a method for producing a high density thin multilayer wiring board, in which an organic resin film composite comprising an organic resin film having a thickness of 10 µm to 50 µm and a relative permittivity of 2.2 to 4.0, a wiring pattern having a thickness of 5 µm to 30 µm formed on the front surface thereof, and an adhesive layer having a thickness of 10 µm to 30 µm and a relative permittivity of 2.2 to 4.0 formed on the rear surface thereof, is subjected to thermocompression bonding after lamination so as to provide interlayer adhesion and curing of the adhesive layer. In the method disclosed in Japanese Laid-Open Publication No. 8-186376, the adhesive layer and the organic resin film, which has a coefficient of linear expansion which is different by no more than 8 ppm/° C. from that of the wiring pattern, are used, thereby removing occurrence of warpage and misalignment of the wiring pattern. The adhesive layer is made of a mixture of an epoxy polymer (a monomer or an oligomer) and a polyimide or a polyamide. The adhesive layer is formed by drying at 90° C. for 30 minutes before the lamination, and is cured during thermocompression bonding.

Japanese Laid-Open Publication No. 9-139558 discloses a bare-chip packaging substrate in which a conductive wire is formed directly on a surface of an organic polymer film having a coefficient of linear expansion of $-5 \times 10^{-6}$/K to $5 \times 10^{-6}$/K and a modulus of elasticity (Young's modulus) of at least 7 GPa. The organic polymer film is laminated via an adhesive film having a modulus of elasticity (Young's modulus) of no more than 7 GPa. By reducing thermal expansion of the organic polymer film, the packaging substrate suppresses occurrence of cracking or peeling.

Japanese Laid-Open Publication No. 9-55583 discloses a multilayer printed wiring board comprising an insulating film material which exhibits adhesiveness by heating, where the adhesion temperature, at which the adhesiveness appears, is lower than the adhesive temperature of a conductive bonding material, thereby preventing wire breakage.

Japanese Laid-Open Publication No. 11-148053 discloses a heat resistant plastic film multilayer structure in which an adhesive layer is formed on a side of a heat resistant plastic film, where the resin flow of the adhesive layer is 3.0 to 5.0% so that the roughness of an inner layer circuit does not appear on a surface.

DISCLOSURE OF THE INVENTION

A problem to be solved by the present invention is to provide a multilayer structure suitable for production of a multilayer wiring board using a build-up method. More particularly, a problem to be solved by the present invention is to provide a multilayer structure having a high heat resistance, a narrow pitch wiring pattern, a small-diameter via, an insulating layer having a uniform thickness, an appropriately low coefficient of linear expansion, a high metal/polymer film adhesiveness, and excellent electrical properties and an excellent balance of physical properties for achieving a stable multilayer wiring board, and a multilayer wiring board using the same.

BEST MODE FOR CARRYING OUT THE INVENTION

As a result of rigorous studies, the present inventors found that a multilayer structure described below can solve the above-described problems and completed the present invention.

The present invention provides a multilayer structure comprising a conductor layer, an adhesive layer, and a polymer film layer interposed between the conductor layer and the adhesive layer.

Preferably, the coefficient of linear expansion of the polymer film layer is no more than $2.0 \times 10^{-5}/°$ C.

Preferably, the polymer film layer has a modulus of tensile elasticity of at least 5 GPa, a coefficient of linear expansion of no more than $2.0 \times 10^{-5}/°$ C., and a water absorption ratio of no more than 1.5%.

Preferably, the dielectric loss tangent of the polymer film layer is no more than 0.01.

Preferably, the dielectric breakdown voltage of the polymer film layer is at least 200 kV.

Preferably, the polymer film layer contains an element selected from the group consisting of Al, Si, Ti, Mn, Fe, Co, Cu, Zn, Sn, Sb, Pb and Bi.

Preferably, the adhesive layer contains a resin composition containing a thermosetting resin.

Preferably, the resin composition contains a thermoplastic polyimide and a thermosetting resin at a ratio of 95:5 to 10:90, thereby making it possible to obtain a multilayer structure having an improved resin flow property and an excellent surface flatness.

Preferably, the thermoplastic polyimide is a soluble polyimide.

Preferably, the thermoplastic polyimide is a polyimide made of a substance selected from the group consisting of ESDA (2,2-bis(4-hydroxyphenyl)propanedibenzoate-3,3',4,4'-tetracarboxylic dianhydride), and TMEG (3,3',4,4'-ethyleneglycoldibenzoate-tetracarboxylic dianhydride).

Preferably, the thermoplastic polyimide is a polyimide made of a substance selected from the group consisting of APB (1,3-bis(3-aminophenoxy)benzene) and BAPS-M (bis (4-(3-aminophenoxy)phenyl)sulfone).

Preferably, the thermoplastic polyimide is a polyimide having a functional group selected from the group consisting of a hydroxyl group and a carboxyl group.

Preferably, a surface of the multilayer structure has projections and depressions having a height or depth of no more than 2 μm.

Preferably, the adhesive layer has a thickness 0.5 to 2.0 times the thickness of the inner layer circuit.

Preferably, the conductor layer and the polymer film layer are adhered together with an initial adhesive strength of at least 7 N/cm in a peel test of 50 mm/min in a 90-degree direction.

Preferably, the polymer film layer and the adhesive layer are adhered together with an initial adhesive strength of at least 7 N/cm in a peel test of 50 mm/min in a 90-degree direction.

Preferably, the conductor layer is a metal conductor layer formed directly on the polymer film layer.

Preferably, the polymer film layer is a polyimide film.

Preferably, the polyimide film is an aromatic polyimide film.

Preferably, the polyimide film is a polyimide film made of an acid anhydride selected from the group consisting of PMDA (pyromellitic dianhydride), BPDA (biphenyltetracarboxylic dianhydride), BTDA (benzophenonetetracarboxylic dianhydride), TMHQ (p-phenylenebis(trimellitic acid monoester anhydride)), and ESDA (2,2-bis(4-hydroxyphenyl)propanedibenzoate-3,3',4,4'-tetracarboxylic dianhydride).

Preferably, the polyimide film is a polyimide film made of a diamine component selected from the group consisting of diaminodiphenylether, paraphenylenediamine, and DABA (dibenzanilide).

The multilayer structure of the present invention has the conductor layer on one side of the polymer film and the adhesive layer on the other side. With this arrangement, when a multilayer wiring board is produced by a build-up method using the multilayer structure of the present invention, the, polymer film and the adhesive layer constitutes the insulating layer, thereby preventing the insulating layer from becoming extremely thin and achieving an uniform thickness of the insulating layer.

The polymer film used in the present invention is preferably made of a material having dimensional stability, heat resistance and mechanical strength, including, for example, a film of polyolefin (e.g., polyethylene, polypropylene, polybutene), polyester (e.g., ethylene-vinylalcohol copolymer, polystyrene, polyethylene terephthalate, polybutylene terephthalate, and ethylene-2,6-naphthalate), nylon-6, nylon-11, aromatic polyamide, polyamide imide resin, polycarbonate, polyvinyl chloride, polyvinylidene chloride, polyketone-based resin, polysulfone-based resin, polyphenylenesulfide resin, polyetherimide resin, fluorocarbon resin, polyarylate resin, liquid crystal polymer resin, polyphenylene ether resin, polyimide, or the like.

Preferably, the polymer film contains at least one element selected from the group consisting of Al, Si, Ti, Mn, Fe, Co, Cu, Zn, Sn, Sb, Pb and Bi. As used herein, "containing an element" indicates that the element is caused to be present on a surface of the film and/or inside the film.

When such polymer films are used in a multilayer structure having an arrangement of a conductor layer/a polymer film/an adhesive layer, the initial adhesive strength of the film and the conductor layer may be at least 7 N/cm in a peel test where the conductor layer is peeled off at 50 mm/min in a 90-degree direction.

A polymer film having an initial adhesive strength of at least 7 N/cm with respect to a conductor layer can be used in a multilayer structure further comprising an adhesive layer, thereby obtaining a multilayer structure in which the adhesive strength with respect to the conductor layer is stable. Further, the multilayer structure can be used to obtain a multilayer wiring board.

The thickness of the polymer film used in the present invention may be appropriately selected depending on the application, specifically, to be 5 to 300 µm, preferably 5 to 125 µm, and more preferably 5 to 75 µm. In order to form a small-diameter via, the thickness of the polymer film is preferably no more than 50 µm, more preferably no more than 35 µm, and even more preferably 25 µm. In one aspect, a polymer film having a thin thickness while securing sufficient electrical insulation performance, is particularly desirable.

Further, the polymer film preferably has a modulus of tensile elasticity of at least 5 GPa, particularly at least 6 GPa, in order to confer a sufficient rigidity to the multilayer structure of the present invention and a build-up wiring board.

Further, since thermal stability is required in processing a build-up multilayer wiring board, the polymer film preferably has a coefficient of linear expansion of no more than $2.0 \times 10^{-5}/°$ C., more preferably no more than $1.5 \times 10^{-5}/°$ C., and even more preferably $1.0 \times 10^{-5}/°$ C. at a temperature of 100° C. to 200° C. in order to secure dimensional stability.

Further, a polymer film having a low water absorption ratio is desirable in order to prevent occurrence of defects, such as expansion due to heat during processing. The water absorption ratio of a polymer film measured in accordance with ASTM-D570 varies depending on the thickness irrespective of the same composition. A polymer film having a composition such that the water absorption ratio of the film having a thickness of 25 µm is preferably no more than 1.5%, and more preferably no more than 1.2%, is preferable.

An exemplary film having the above-described properties is a polyimide film. The polyimide film is obtained by imidating poly(amic acid) as its precursor. Poly(amic acid) can be produced by a known method. Specifically, substantially equal mols of one or more tetracarboxylic dianhydride component and one or more diamine component are used in an organic polar solvent to undergo polymerization, resulting in a poly(amic acid) solution.

The polymerization may be performed by any known method, for example, the method described in Japanese Laid-Open Publication No. 63-166287, Japanese Laid-Open Publication No. 59-164328, and the like. The level of the polymerization, the acid dianhydride component of the material, the order and method of adding a diamine component into a reaction system are arbitrarily selected.

For example, reactions in the present invention are performed by various methods as follows.

(a) A method of mixing diamines with an acid dianhydride in advance, and adding the mixture into a solvent solution little by little while stirring the solution.

(b) Conversely, a method of adding a solvent into a mixture of diamines and an acid dianhydride while stirring the mixture.

(c) A method of adding an acid dianhydride into a solvent, in which only diamines has been dissolved, at a rate at which the reaction rate can be controlled.

(d) A method of adding diamines into a solvent, in which only a tetracarboxylic dianhydride has been dissolved, at a rate at which the reaction rate can be controlled.

(e) A method of preparing solvents in which diamines and an acid dianhydride are separately dissolved, and gradually adding the solutions to a reaction vessel.

(f) A method of preparing poly(amic acid) containing an excess amount of diamines and poly(amic acid) containing an excess amount of an acid dianhydride in advance, and allowing the poly(amic acid)s to react with each other in a reaction vessel.

(g) A method of first allowing a portion of diamines to react with an acid dianhydride, and thereafter allowing the remaining diamines to react with the acid dianhydride, or vice versa.

When aromatic diester acid dianhydride and tetracarboxylic dianhydride are used as acid dianhydride components, a particularly preferable polymerization method is a method of first allowing one acid dianhydride to react with a diamine component to generate a first poly(amic acid), and then allowing the other acid dianhydride to react with the diamine component to generate a second poly(amic acid).

Examples of the tetracarboxylic dianhydride component used in production of a film representatively include aromatic tetracarboxylic dianhydrides, such as pyromellitic dianhydride, 3,3',4,4'-benzophenonetetracarboxylic dianhydride, 3,3',4,4'-diphenylsulfonetetracarboxylic dianhydride, 1,4,5,8-naphthalenetetracarboxylic dianhydride, 2,3,6,7-naphthalenetetracarboxylic dianhydride, 4,4'-oxydiphthalic anhydride, 3,3',4,4'-dimethyldiphenylsilanetetracarboxylic dianhydride, 3,3',4,4'-tetraphenylsilanetetracarboxylic dianhydride, 1,2,3,4-furantetracarboxylic dianhydride, 4,4'-bis(3,4-dicarboxyphenoxy)diphenylpropane dianhydride, 4,4'-hexafluoroisopropylidenediphthalic anhydride, 3,3',4,4'-biphenyltetracarboxylic dianhydride, 2,3,3',4'-biphenyltetracarboxylic dianhydride, p-phenylenebis(trimellitic acid monoester anhydride), 2,2-bis(4-hydroxyphenylpropanebenzoate-3,3',4,4'-tetracarboxylic dianhydride, and p-phenylenediphthalic anhydride.

Examples of the tetracarboxylic dianhydride suitable for obtaining a polyimide film which has a modulus of tensile elasticity of at least 5 GPa and a coefficient of linear expansion of no more than $2.0 \times 10^{-5}/°$ C. and a water absorption ratio of no more than 1.5%, include acid anhydrides selected from the group consisting of PMDA (pyromellitic dianhydride), BTDA (benzophenonetetracarboxylic dianhydride), TMHQ (p-phenylenebis(trimellitic acid monoester anhydride)), and ESDA (2,2-bis(4-hydroxyphenyl)propanedibenzoate-3,3',4,4'-te tracarboxylic dianhydride). Further, 0 to 80 mol % pyromellitic dianhydride or 20 to 80 mol % p-phenylenebis(trimellitic acid monoester anhydride) may be used with respect to the overall amount of acid dianhydride components. It should be noted that combinations of tetracarboxylic dianhydrides as described herein are specific examples for obtaining a polyimide film suitable for a polymer film constituting the multilayer structure of the present invention. The present invention is not limited to the combinations. The combination and molar ratio of tetracarboxylic dianhydrides used can be changed to adjust the properties of a polyimide film.

On the other hand, examples of the diamine component of a polyimide used in the polymer film of the present invention, include aromatic diamines, such as 4,4'-diaminodiphenylether, 3,4'-diaminodiphenylether, 2,2-bis(4-aminophenoxyphenyl)propane, 1,4-bis(4-aminophenoxy)benzene, 1,3-bis(4-aminophenoxy)benzene, 1,3-bis(3-aminophenoxy)benzene, bis(4-(4-aminophenoxy)phenyl)sulfone, bis (4-(3-aminophenoxy)phenyl)sulfone, 4,4'-bis(4-aminophenoxy)biphenyl, 2,2-bis(4-aminophenoxyphenyl)hexafluoropropane, 4,4'-diaminodiphenylsulfone, 3,3'-diaminodiphenylsulfone, 9,9-bis(4-aminophenyl)fluorene, bisaminophenoxyketone, 4,4'-(1,4-phenylenebis(1-methylethylidene))bisaniline, 4,4'-(1,3-phenylenebis(1-methylethylidene))bisaniline, metaphenylenediamine, paraphenylenediamine, diaminobenzanilide, 3,3'-dimethyl-4,4'-diaminobiphenyl, and 3,3'-dimethoxy-4,4'-diaminobiphenyl, or other aliphatic diamines.

Examples of the diamine component suitable for obtaining a polyimide film which has a modulus of tensile elasticity of at least 5 GPa and a coefficient of linear expansion of no more than $2.0\times10^{-5}/°C$ and a water absorption ratio of no more than 1.5%, includes diaminodiphenylether, paraphenylenediamine, and diaminobenzanilide. Further, 20 to 80 mol % paraphenylenediamine and/or 4,4'-diaminobenzanilide or 80 to 20 mol % 4,4'-diaminodiphenylether may be used with respect to the diamine components. It should be noted that combinations of diamine components as described herein are specific examples for obtaining a polyimide film suitable for a polymer film constituting the multilayer structure of the present invention. The present invention is not limited to the combinations. The combination and molar ratio of diamine components used can be changed to adjust properties of a polyimide film.

When a polyimide film is used as a polymer film constituting the multilayer structure of the present invention, the average molecular weight of a poly(amic acid) as the precursor is desirably 10,000 to 1,000,000. If the average molecular weight is less than 10,000, a resultant film may be brittle. On the other hand, if the average molecular weight exceeds 1,000,000, a poly(amic acid) varnish as a polyimide precursor has an excessive viscosity and is likely to be difficult to handle.

Further, it is possible to add various organic additives, inorganic fillers, or various reinforcements to a poly(amic acid) to obtain a complex polyimide film.

Examples of an organic polar solvent used in a reaction for generating a poly(amic acid) copolymer, include sulfoxide-family solvents (e.g., dimethylsulfoxide and diethylsulfoxide), formamide-family solvents (e.g., N,N-dimethylformamide and N,N-diethylformamide), acetoamide-family solvents (e.g., N,N-dimethylacetoamide and N,N-diethylacetoamide), pyrrolidone-family solvents (e.g., N-methyl-2-pyrrolidone and N-vinyl-2-pyrrolidone), phenol-family solvents (e.g., phenol, o-, m- or p-cresol, xylenol, phenol halide, and catechol), hexamethyl phosphoramide, and γ-butyrolactone. These solvents are desirably used alone or in combination, or further an aromatic hydrocarbon, such as xylene or toluene can be partially used. Preferably, the generated poly(amic acid) is dissolved in an organic polar solvent in the concentration range of 5 to 40% by weight, preferably 10 to 30% by weight, and more preferably 12 to 27% by weight, leading to advantages such as ease of handling a poly(amic acid) solution.

The polyimide film is obtained by imidating a poly(amic acid) copolymer. Imidation may be performed either thermal curing or chemical curing.

Thermal curing is a method for carrying out an imidation reaction only by heating without action of a ring-closing dehydration agent.

Chemical curing is a method for allowing a chemical converting agent and a catalyst to act on an organic poly(amic acid) solvent solution. Examples of the chemical converting agent include aliphatic anhydride, aromatic anhydride, N,N-dialkylcarbodiimide, lower aliphatic halide, lower fatty acid anhydride halide, arylphosphonate dihalide, thionylhalide, or a mixture of at least two thereof. Among them, aliphatic anhydrides, such as acetic anhydride, propionic anhydride, and butyric anhydride, or a mixture of at least two thereof, may be preferably used.

As the catalyst, aliphatic tertiary amine, aromatic tertiary amine, heterocyclic tertiary amine, or the like are used. Among them, isoquinoline, β-picoline, pyridine, or the like is particularly preferably used.

Chemical curing is preferable since a generated polyimide film has excellent mechanical properties, such as extensibility, tensile strength, and the like. Further, chemical curing may be used in combination with thermal curing. Reaction conditions for imidation may vary depending on the type of a poly(amic acid), the thickness of a film, the choice of thermal curing and/or chemical curing, and the like.

Specifically, using chemical curing as an example, a method for producing a polyimide film from a poly(amic acid) organic solvent solution will be described below.

Initially, the poly(amic acid) composition obtained as described above is mixed with a chemical converting agent and a catalyst, and the mixture is flow cast and applied onto a support. Thereafter, the mixture is mildly heated, for example, at 100° C. so that the chemical converting agent and the catalyst are activated. As a result, the mixture is transitioned to a poly(amic acid) film which is partially cured or partially dried (hereinafter referred to as a gel film).

The gel film is an intermediate of imidation from poly(amic acid) to polyimide, having self supporting capability. The gel film is partially cured or partially dried, in which a poly(amic acid) and an imidated polyimide coexist. The volatile component content and the imidation rate of the gel film are adjusted to predetermined ranges. The volatile component content is calculated according to expression 1:

$$(A-B)\times 100/B \quad \text{expression 1}$$

where A and B represent the following:
A: the weight of the gel film, and
B: the weight of the gel film after being heated at 450° C. for 20 minutes.

The imidation rate is calculated by infrared absorptiometric analysis according to expression 2:

$$(C/D)\times 100/(E/F) \quad \text{expression 2}$$

where C, D, E, and F represent the following:
C: the absorption peak height of the gel film at 1370 $cm^{-1}$,
D: the absorption peak height of the gel film at 1500 $cm^{-1}$,
E: the absorption peak height of the polyimide film at 1370 $cm^{-1}$, and
F: the absorption peak height of the polyimide film at 1500 $cm^{-1}$.

The volatile component content is in the range of 5 to 300% by weight, preferably 5 to 100% by weight, and more preferably 5 to 50% by weight. The imidation rate is in the range of at least 50% by weight, preferably at least 70% by weight, more preferably at least 80% by weight, and most preferably at least 85% by weight.

The obtained gel film is preferably subjected to stepwise heating and dried for imidation while being held at an end thereof by a tenter clip or pin for suppressing shrinkage in order to suppress shrinkage in a tenter step, resulting in a polyimide film. Specifically, the gel film is preferably subjected to stepwise heating from about 200° C. and eventually at least 500° C. for 15 to 400 seconds.

The above-described polyimide film may contain a polyimide containing at least one repeating unit represented by the following formula (1) in the molecule:

(1)

where R¹ represents a bivalent organic group selected from the group consisting of the following:

where R⁴ represents CH₃—, Cl—, Br—, F— or CH₃O—; and R represents the following:

where n represents an integer of 1 to 3, X represents a monovalent substituent selected from the group consisting of hydrogen, halogen, carboxyl groups, lower alkyl groups having no more than 6 carbon atoms, and lower alkoxy groups having no more than 6 carbon atoms; and bivalent organic groups represented by where Y and Z independently represent a monovalent substituent selected from the group consisting of hydrogen, halogen, carboxyl groups, lower alkyl groups having no more than 6 carbon atoms, and lower alkoxy groups having no more than 6 carbon atoms, A represents a bivalent linking group selected from the group consisting of —O—, —S—, —CO—, —CONH—, —SO—, —SO₂—, —CH₃—, and (CH₃)₂—, and A is preferably —O—.

The above-described polyimide film may contain a polyimide containing at least two repeating units represented by the above-described (1) in the molecule, where in the at least two repeating units represented by the above-described (1), a combination of a repeating unit in which A of the R is —CONH— and another repeating unit in which A is —O— is preferred.

The polyimide film may further contain a repeating unit represented by the following formula (2):

(2)

where R is the same as R in the above-described formula (1), R³ represents a tetravalent organic group selected from the group consisting of the following:

-continued and

Preferably, the polyimide containing the repeating unit represented by the above-described formula (1) in the molecule may contain a repeating unit represented by the above-described formula (3):

(3)

where R is the same as the R in the above-described formula (1).

More preferably, the polyimide containing the repeating unit represented by the above-described formula (1) in the molecule, may contain a repeating unit represented by formula (4) below and another repeating unit represented by formula (5) below:

(4)

where $R^2$ represents a bivalent organic group selected from the group consisting of:

(5)

where $R^2$ is the same as the $R^2$ in the above-described formula (4), and $R^3$ is the same as the $R^3$ in the above-described formula (2).

Even more preferably, the polyimide containing the repeating unit represented by the above-described formula (1) in the molecule, may contain a repeating unit represented by formulas (6) to (9) below as a main repeating unit in the molecule:

(6)

(7)

(8)

and

Assuming that the number of repeating units represented by the above-described formulas (6) to (9) are represented by a, b, c and d, respectively, and a+b+c+d=s, it is preferably that all values of (a+b)/s, (a+c)/s, (b+d)/s, and (c+d)/s fall within the range of 0.25 to 0.75. In this case, the obtained polyimide film is provided with excellent electrical properties and an excellent balance of physical properties (low linear expansion, high elasticity and low water absorption).

Alternatively, the above-described polyimide film may contain an imide repeating unit made of TMHQ and DABA (hereinafter referred to as TMHQ-DABA) and an imide repeating unit made of TMHQ and ODA (hereinafter referred to as TMHQ-ODA). Assuming that the number of the repeating units represented by TMHQ-DABA and TMHQ-ODA are represented by e and f, respectively, it is preferably that e:f falls within the range of 80:20 to 20:80, thereby providing excellent electrical properties and an excellent balance of physical properties (low linear expansion, high elasticity and low water absorption) to the obtained polyimide film.

When the above-described polymer film contains an element selected from the group consisting of Al, Si, Ti, Mn, Fe, Co, Cu, Zn, Sn, Sb, Pb and Bi, the film can have an initial adhesive strength of at least 7 N/cm with respect to a conductor layer in a peel test where the conductor layer is peeled off in a 90-degree direction.

An element selected from the group consisting of Al, Si, Ti, Mn, Fe, Co, Cu, Zn, Sn, Sb, Pb and Bi is preferably in the form of an organic or inorganic compound. Specifically, examples of the inorganic compound include halide (e.g., chloride and bromide), oxide, hydroxide, carbonate, nitrate, nitrite, phosphate, sulfate, silicate, borate, and condensed phosphate.

Examples of the organic compound include alkoxides, acylate, chelates, neutral molecules (e.g., diamine and diphosphine), an organic compound having an acetylacetonate ion, a carbonate ion, dithiocarbamate ion, and the like, and circular ligand (e.g., porphyrin).

Among them, preferable elements are Si, Ti and Sn. A compound containing these elements is provided in the form of an alkoxide, an acylate, a chelate, or a metal salt. Examples of such a compound include aminosilane-family compounds (e.g., N-β(aminoethyl)γ-aminopropyltrimethoxysilane, N-β(aminoethyl)γ-aminopropylmethyldimethoxysilane, and N-phenyl-γ-aminopropyltrimethoxysilane), and epoxy silane-family compounds (e.g., β-(3,4epoxycyclohexyl)ethyltrimethoxysilane, γ-glycidoxypropyltrimethoxysilane, and γ-glysidoxypropylmethyldimethoxy-silane).

Among the above-described elements, a particularly preferable element is titanium. A preferable compound containing a titanium element is represented by formula (10) below:

(10)

where m is an integer of 0 to 4, a hydrocarbon residue of $C_3$ to $C_{13}$, or a residue of carboxylic acid of $C_3$ to $C_{13}$ or an ammonium salt thereof $R_1$: —H or a hydrocarbon residue of $C_3$ to $C_{13}$, $R_2$, $R_3$: a hydrocarbon residue of $C_3$ to $C_{13}$, $R_2$: a hydrocarbon residue of $C_3$ to $C_{13}$, or $R_5$, $R_6$: a hydrocarbon residue of $C_3$ to $C_{13}$, $R_7$: a hydrocarbon residue of $C_3$ to $C_{13}$.

Specifically, tri-n-butoxytitanium monostearate, diisopropoxytitaniumbis(triethanolaminate), butyltitanate dimer, tetranormalbutyltitanate, tetra(2-ethylhexyl)titanate, and titanium octyleneglycolate. In addition, dihydroxybis(ammonium lactate)titanium, dihydroxytitaniumbislactate, and the like can be used. The most preferable compounds containing titanium are tri-n-butoxytitanium monostearate or dihydroxytitanium bislactate.

Various methods may be used to cause the above-described elements to be contained in a polymer film. Examples of such method include mixing the element with a material in a production process, and applying the element on a molded film which is in turn dried. By either of the methods, a film can be achieved such that when the film is laminated with a conductor layer, the initial adhesive strength of the conductor layer and the film is at least 7 N/cm in a peel test where the conductor layer is peeled off at 50 mm/min in a 90-degree direction.

A method for causing at least one metal selected from the group consisting of Al, Si, Ti, Mn, Fe, Co, Cu, Zn, Sn, Sb, Pb and Bi to be contained in a polymer film will be described, for example, where the polymer film is made of polyimide.

In this method, a compound containing at least one element selected from the group consisting of Al, Si, Ti, Mn, Fe, Co, Cu, Zn, Sn, Sb, Pb and Bi, is mixed with a solution containing poly(amic acid) as a polyimide precursor, and thereafter, the poly(amic acid) is converted into polyimide.

In the step of mixing the compound containing the element with the poly(amic acid) solution, the compound containing at least one element selected from the group consisting of Al, Si, Ti, Mn, Fe, Co, Cu, Zn, Sn, Sb, Pb and Bi, may be in the form of liquid, colloid, slurry, or solid.

Preferably, the compound is mixed in a form of diluted solution in an appropriate solvent, securing ease of handling, the homogeneity of the mixture, and the like. The order of mixing acid anhydride, diamine, and the compound containing the element, a chemical converting agent, and a catalyst is basically not limited.

Another method of causing the above-described element to be contained in a polyimide film is a method comprising applying a solution containing a compound containing at least one element selected from the group consisting of Al, Si, Ti, Mn, Fe, Co, Cu, Zn, Sn, Sb, Pb and Bi onto a gel film after production of the gel film, and thereafter, imidating the film by heating and drying to obtain a polyimide film.

In the step of applying the solution containing the element onto the gel film, a known application method which can be used by those skilled in the art may be used. Examples of such an application method include gravure coating, spray coating, knife coating, and dip coating. The dip coating may be particularly preferably used in terms of ease of handling and the simplicity of tools.

It should be noted that in various methods for producing a polyimide containing an element for use in the multilayer structure of the present invention, a solvent used for: a solution containing a compound containing at least one element selected from the group consisting of Al, Si, Ti, Mn, Fe, Co, Cu, Zn, Sn, Sb, Pb and Bi, which is used so as to mix a compound containing the element with a poly(amic acid) solution; a solution of the compound containing the element, which is applied onto a gel film; and a solution of the compound containing the element, which is used so to immerse a gel film therein, is any solvent which can dissolve the compounds. Examples of the solvent include water, toluene, tetrahydrofuran, 2-propanol, 1-butanol, ethyl acetate, N,N-dimethylformamide, and acetylacetone. At least two of these solvents may be mixed together for use. In the present invention, N,N-dimethylformamide, 1-butanol, 2-propanol and water may be particularly preferably used.

The gel film is preferable, since by adding a step of removing excess liquid drops from the surface of a film after applying a solution of the compound containing the element onto the film or immersing the film in the solution, a polyimide film having an excellent appearance with no irregularities on the film surface can be obtained.

For the removal of the liquid drops, a known method, such as nip rolling, air knife, and doctor blade, is available. nip rolling may be preferably used in terms of appearance, liquid clearance character, ease of handling, and the like of a film.

A gel film, on to which a solution containing at least one element selected from the group consisting of Al, Si, Ti, Mn, Fe, Co, Cu, Zn, Sn, Sb, Pb and Bi is applied or which is immersed in the solution, is peeled off a support, and is dried while an end thereof is fixed so as to avoid shrinkage in curing, to remove water, a residual solvent, a residual converting agent, and a catalyst, where a poly(amic acid) is converted into a polyimide, thereby obtaining a polyimide film for use in the polyimide multilayer structure of the present invention. Conditions for the drying are the same as those in the above-described polyimide producing method.

A method for producing a polymer film containing at least one element selected from the group consisting of Al, Si, Ti, Mn, Fe, Co, Cu, Zn, Sn, Sb, Pb and Bi can be applied to the above-described polymer films, but not limited to a polyimide containing the above-described elements. Specifically, a polymer film containing the element can be produced by a method of mixing the element in a production process of a material or an intermediate, and immersing, applying, and the like a film in a manufacturing process. These elements are preferably added in the concentration range of 10 ppm to 10,000 ppm.

The thus-obtained polymer film containing at least one element selected from the group consisting of Al, Si, Ti, Mn, Fe, Co, Cu, Zn, Sn, Sb, Pb and Bi may achieve a film such that when the film is laminated with a conductor layer, the film can have an initial adhesive strength of at least 7 N/cm with respect to a conductor layer in a peel test where the conductor layer is peeled off at 50 mm/min in a 90-degree direction. This polymer film may be further provided with satisfactory hydrolysis resistance while maintaining the above-described adhesive strength. Specifically, the polymer film may have a property such that the retentivity of tear propagation strength after exposure under environment of 150° C. and 100% RH for 12 hours is at least 80% of the initial tear propagation strength, and may be resistant to high temperature and high humidity. When such a polymer film is used in the multilayer structure and the multilayer wiring board of the present invention, the polymer film exhibits excellent electrical insulation performance with no degradation of the insulation performance under high-temperature and high-humidity environment.

It should be noted that to the polymer film containing at least one element selected from the group consisting of Al, Si, Ti, Mn, Fe, Co, Cu, Zn, Sn, Sb, Pb and Bi, an inorganic or organic filler, a plasticizer (e.g., an organic phosphorous compound), an antioxidant, a light stabilizer, a flame retardant, an antistatic agent, a heat stabilizer, and an ultraviolet sorbent, which are known to those skilled in the art, or various known reinforcing agents may be added by a known method, or known surface treatment, such as corona discharge treatment or plasma discharge treatment, may be applied.

Further, for the purpose of improving adhesiveness to a conductor layer and an adhesive layer, a polymer film may be subjected to post treatment after the production process. For example, there is a method of forming a metal adhesive layer or a metal oxide adhesive layer on a surface of a polyimide film by sputtering or ion-implanting a metal, such as Cr, Ni, Ti and Mo, or an oxide thereof onto the surface of the polymer film in order to improve an adhesiveness of the surface to a conductor layer. Examples of the surface treatment for the film include a method of applying various organic substances (e.g., a thermosetting resin, a thermoplastic resin, an organic monomer, and a coupling agent) as a primer, a method of surface treatment using a metal hydroxide, an organic alkali, or the like, a method of plasma treatment or corona treatment, and a method of surface grafting. These methods may be performed alone or in combination for the surface treatment of a polymer film.

The above-described surface treatment methods can be utilized to improve adhesiveness to the other surface of the polymer film to an adhesive layer.

Next, a conductor layer constituting the multilayer structure of the present invention will be described. The multilayer structure of the present invention has a conductor layer on one surface of a polymer film.

Examples of a method of forming a conductor layer on one surface of a polymer film, include a method of forming the conductive layer on the surface of the polyimide film by a method of adhere metal foil, such as copper foil, via an adhesive, a direct method of applying, drying and curing conductive paste, such as silver paste, or a method of plating, or the like.

Among them, plating can form a thin metal conductor layer directly on a surface of a polymer film, and therefore, is advantageous when a narrow pitch circuit pattern is to be formed by etching. The metal conductor layer is preferably formed directly on a polymer film surface by a vacuum thin film method, an electrolytic plating method, an electroless plating, or the like, alone or in combination.

Examples of the vacuum thin film method include sputtering, resistance heating vacuum deposition, ion beam deposition, electron beam deposition, and ion plating. The type of the metal conductor is not particularly limited as long as it is a conductive metal. A preferably metal conductor is a metal, such as Cu, Al, Au, Ag, Cr, Ni, W, Ti, Mo, and Co, alone or an alloy of at least two thereof. Further, it is also possible to combine these metals. That is, it is possible that after a metal underlying layer is provided, a metal of another type is provided on the underlying layer. When an underlying metal layer is provided before another metal layer is provided on the underlying layer, oxides of the above-described metals and alloys can be used.

The thickness of the conductor layer is not particularly limited, although the production of a narrow pitch circuit pattern requires a thickness of no more than 12 μm, more preferably no more than 10 μm, and even more preferably no more than 8 μm. The metal conductor layer can be formed to a predetermined thickness by the vacuum thin film method, although it is preferable that the metal conductor layer is formed by the vacuum thin film method to 0.01 μm to 2 μm, preferably 0.05 μm to 1 μm, and thereafter, electroless plating or electrolytic plating or a combination thereof is used to obtain the conductor layer having a predetermined thickness.

Next, an adhesive layer constituting the multilayer structure of the present invention will be described. An adhesive layer is formed on a surface of a polymer film opposite to another surface on which a conductor layer is provided, the layers being integrated together. The adhesive layer has a function of adhering the layers each other when the multilayer structure of the present invention is laminated by a method, such as hot pressing and hot roll laminating to produce a multilayer plate. Thereby, an inner layer circuit is securely fixed while being buried in the adhesive. An adhesive used for this purpose preferably has high heat resistance, taking into consideration a measure to a lead-free high-melting-point sold with recent concern for environment, and a measure to an increase in substrate temperature with an increase in conductor resistance due to a narrower pitch of a circuit pattern.

The thickness of the adhesive layer may be 0.5 to 2.0 times the thickness of the circuit pattern (indicated by reference numeral 7 in FIG. 1), such that when the multilayer structure of the present invention is laminated on the circuit pattern, the circuit pattern is preferably buried in the adhesive layer. The thickness of the adhesive layer depends on the thickness of the conductor layer in which the circuit pattern is to be formed. The adhesive layer preferably has a thickness greater than or equal to that of the conductor layer for the purpose of burying the circuit pattern.

The resin composition of the adhesive layer is not particularly limited as long as it meets the above-described requirements. Various known resins can be used, and are roughly divided into two groups: (A) heat seal adhesives using thermoplastic resin and (B) curing adhesives utilizing a curing reaction of thermosetting resin. These will be described below.

(A) Examples of the thermoplastic resin conferring heat seal to an adhesive include polyimide resin, polyamideimide resin, polyetherimide resin, polyamide resin, polyester resin, polycarbonate resin, polyketone-based resin, polysulfone-based resin, polyphenyleneether resin, polyolefin resin, polyphenylenesulfide resin, fluorocarbon resin, polyarylate resin, and liquid crystal polymer resin. An appropriate composition of one or more of these resins can be used for the adhesive layer of the multilayer structure of the present invention. Among them, thermoplastic polyimide resin is preferably used in terms of excellent heat resistance, electrical reliability, and the like.

Next, a method of producing thermoplastic polyimide resin will be described. Polyimide resin is obtained from a precursor poly(amic acid) solution. The poly(amic acid) solution can be produced by a known method. Specifically, a tetracarboxylic dianhydride component and a diamine component are used in substantially equimolar quantities and are polymerized in an organic polar solvent. Acid dianhydride for use in the thermoplastic polyimide resin is not particularly limited. Examples of the acid dianhydride component include aliphatic or alicyclic tetracarboxylic dianhydride (e.g., butanetetracarboxylic dianhydride, 1,2,3,4-cyclobutanetetracarboxylic dianhydride, 1,3-dimethyl-1,2,3,4-cyclobutanetetracarboxylic acid, 1,2,3,4-cyclopentanetetracarboxylic dianhydride, 2,3,5-tricarboxycyclopentylacetic dianhydride, 3,5,6-tricarboxynorbonan-2-acetate dianhydride, 2,3,4,5-tetrahydrofurantetracarboxylic dianhydride, 5-(2,5-dioxotetrahydrofural)-3-methyl-3-cyclohexene-1,2-dicarboxylic dianhydride, and bicyclo[2,2,2]-octo-7-en-2,3,5,6-tetracarboxylic dianhydride); aromatic tetracarboxylic dianhydride (e.g., pyromellitic dianhydride, 3,3',4,4'-benzophenonetetracarboxylic dianhydride, 3,3',4,4'-diphenylsulfonetetracarboxylic dianhydride, 1,4,5,8-naphthalenetetracarboxylic dianhydride, 2,3,6,7-naphthalenetetracarboxylic dianhydride, 4,4'-oxy-phthalic anhydride, 3,3',4,4'-dimethyldiphenylsilanetetracarboxylic dianhydride, 3,3',4,4'-tetraphenylsilanetetracarboxylic dianhydride, 1,2,3,4-furantetracarboxylic dianhydride, 4,4'-bis(3,4-dicarboxyphenoxy)diphenylsulfide dianhydride, 4,4'-bis(3,4-dicarboxyphenoxy)diphenylsulfone dianhydride, 4,4'-bis(3,4-dicarboxyphenoxy)diphenylpropane dianhydride, 4,4'-hexafluoroisopropylidenediphthalic anhydride, 3,3',4,4'-biphenyltetracarboxylic dianhydride, 2,3,3',4'-biphenyltetracarboxylic dianhydride, bis(phthalic acid)phenylphosphineoxide dianhydride, p-phenylenebis(triphenylphthalic acid)dianhydride, m-phenylenebis(triphenylphthalic acid)dianhydride, bis(triphenylphthalic acid)-4,4'-diphenyletherdianhydride, bis(triphenylphthalic acid)-4,4'-diphenylmethanedianhydride), 2,2-bis(4-hydroxyphenyl)propanedibenzoate-3,3',4,4'-tetracarboxylic dianhydride, and TMEG (3,3',4,4'-ethyleneglycoldibenzoate-tetracarboxylic dianhydride). For the purpose of obtaining an excellent heat seal, 2,2-bis(4-hydroxyphenyl)propanedibenzoate-3,3',4,4'-tetracarboxylic dianhydride, 4,4'-hexafluoroisopropylidenediphthalic anhydride, 2,3,3',4'-biphenyltetracarboxylic dianhydride, 4,4'-oxydiphthalic anhydride, 3,3',4,4'-benzophenonetetracarboxylic dianhydride, or TMEG (3,3',4,4'-ethyleneglycoldibenzoate-tetracarboxylic dianhydride) are preferably used.

Examples of the diamine component include 4,4'-diaminodiphenyl ether, 3,4'-diaminodiphenyl ether, 2,2-bis(4-aminophenoxyphenyl)propane, 1,4-bis(4-aminophenoxy)benzene, 1,3-bis(4-aminophenoxy)benzene, 1,3-bis(3-aminophenoxy)benzene, bis(4-(4-aminophenoxy)phenyl)sulfone, bis(4-(3-aminophenoxy)phenyl)sulfone, 4,4'-bis(4-aminophenoxy)biphenyl, 2,2-bis(4-aminophenoxyphenyl)hexafluoropropane, 4,4'-diaminodiphenylsulfone, 3,3'-diaminodiphenylsulfone, 9,9-bis(4-aminophenyl)fluorene, bisaminophenoxyketone, 4,4'-(1,4-phenylenebis(1-methylethylidene))bisaniline, and 4,4'-(1,3-phenylenebis(1-methylethylidene))bisaniline. These are used each alone or in combination of at least two thereof.

Examples of the organic polar solvent used in a generation reaction in the poly(amic acid) solution include a sulfoxide-family solvent (e.g., dimethylsulfoxide and diethylsulfoxide), a formamide-family solvent (e.g., N,N-dimethylformamide and N,N-diethylformamide), an acetoamide-family solvent (e.g., N,N-dimethylacetoamide and N,N-diethylacetoamide), a pyrrolidone-family solvent: (e.g., N-methyl-2-pyrrolidone and N-vinyl-2-pyrrolidone), a phenol-family solvent (e.g., phenol, o-, m-, or p-cresol, xylenol, phenol halide, and catechol), and hexamethyl phosphoramide, and γ-butyrolactone. Further, these organic polar solvents can be used in combination with aromatic hydrocarbons, such as xylene and toluene, if necessary.

The poly(amic acid) solution obtained as described above is subjected to ring-closing dehydration by a thermal or chemical method to obtain a thermoplastic polyimide resin. In this case, either a thermal method of subjecting a poly (amic acid) solution to thermal treatment for dehydration or a chemical method of dehydration using a dehydrator is used.

The thermal ring-closing dehydration may be achieved, for example, by carrying out an imidation reaction by heating the poly(amic acid) solution while evaporating the solvent. With this method, a solid thermoplastic polyimide resin can be obtained. Conditions for the heating are not particularly limited, although the heating is preferably performed at a temperature of no more than 200° C. for about 5 to 120 minutes.

The chemical ring-closing dehydration may be achieved, for example, by adding a dehydrator and a catalyst to the poly(amic acid) solution in amounts greater than or equal to stoichiometric amounts to cause a dehydration reaction, evaporating the organic solvent, and the like. Thereby, a solid thermoplastic polyimide resin can be obtained. Examples of the dehydrator used in the chemical method include aliphatic anhydride (e.g., acetic anhydride), and aromatic anhydride (e.g., benzoic anhydride). Examples of the catalyst include aliphatic tertiary amines (e.g., triethylamine), aromatic tertiary amines (e.g., dimethylaniline), and heterocyclic tertiary amines (e.g., pyridine, α-picoline, β-picoline, γ-picoline, and isoquinoline). For conditions for chemical ring-closing dehydration, the temperature is preferably no more than 100° C., and the evaporation of the organic solvent is performed at a temperature of no more than 200° C. for about 5 minutes to 120 minutes.

As another method for obtaining thermoplastic polyimide resin, there is also a method in which evaporation of a solvent is not performed in thermal or chemical ring-closing dehydration. Specifically, a polyimide resin solution obtained by thermal imidation or chemical imidation using a dehydrator is added to a poor solvent to precipitate polyimide resin. Unreacted monomers are removed. The precipitated polyimide resin is purified and dried, thereby obtaining a solid polyimide resin. The poor solvent is selected to be satisfactorily mixed with a solvent and is not easily dissolved in polyimide, including, for example, but not limited to, acetone, methanol, ethanol, isopropanol, benzene, methylcellosolve, and methylethylketone. With these methods, thermoplastic polyimide resins can be obtained, which are used as an adhesive layer in the multilayer structure of the present invention.

(B) Next, a curing adhesive in which a curing reaction of thermosetting resin is utilized will be described. Examples of thermosetting resin include bismaleimide resin, bisallylnadic imide resin, phenol resin, cyanate resin, epoxy resin, acryl resin, methacryl resin, triazine resin, hydrosilyl curing resin, allyl curing resin, and unsaturated polyester resin. These are used each alone or in combination as required. Other than the above-described thermosetting resins, it is possible to use, as thermosetting component, a side chain reactive group thermosetting polymer having a reactive group, such as an epoxy group, an allyl group, a vinyl group, an alkoxysilyl group, and a hydrosilyl, at a side chain or a terminal of the polymer chain. A side chain reactive group thermosetting polyimide resin having a reactive group at a side chain of the polyimide backbone thereof has excellent heat resistance, and is preferable as the adhesive layer of the present invention.

Hereinafter, the side chain reactive group thermosetting polyimide resin will be described. Examples of a specific production method thereof include (i) a method such that the side chain reactive group thermosetting polyimide resin is produced by a method based on the above-described method for producing thermoplastic polyimide resin, where a diamine component having a functional group (e.g., an epoxy group, a vinyl group, an allyl group, a methacryl group, an acryl group, an alkoxysilyl group, a hydrosilyl group, a carboxy group, a hydroxyl group, and a cyano group) and an acid dianhydride component are used as monomer components to obtain a thermosetting polyimide, and (2) a method such that a solvent-soluble polyimide having a hydroxyl group, a carboxy group, an aromatic halogen group, or the like is produced by a method based on the above-described method for producing thermoplastic polyimide resin, and thereafter a thermosetting polyimide resin is obtained by attaching a functional group (e.g., an epoxy group, a vinyl group, an allyl group, a methacryl group, an acryl group, an alkoxysilyl group, a hydrosilyl group, a carboxy group, a hydroxyl group, and a cyano group) thereto by a chemical reaction.

To the thermosetting resin, a radical reaction initiator (e.g., organic peroxide), a reaction accelerator, a crosslinking auxiliary agent (e.g., triallylcyanurate and triallylisocyanurate), a commonly used epoxy curing agent for improving heat resistance, adhesiveness, and the like, if necessary, (e.g., acid dianhydride family, amine family, and imidazole family), various coupling agents, or the like can be optionally added.

The thermoplastic resin can be mixed with a thermosetting resin for the purpose of controlling the flow ability of an adhesive layer in heat adhesion. To achieve this purpose, 1 to 10000 parts by weight, preferably 5 to 2000 parts by weight, of a thermosetting resin may be added to 100 parts by weight of a thermoplastic resin. Preferably, the thermoplastic resin and the thermosetting resin may be mixed together at a ratio of 95:5 to 10:90 (parts by weight), thereby improving the flow property of the resin and obtaining a multilayer structure having excellent surface flatness. If the amount of the thermosetting resin is excessively great, the adhesive layer is likely to become brittle. Conversely, if the amount of the thermosetting resin is excessively small, the resin is likely to overflow the adhesive layer or the adhesiveness is likely to be reduced.

Hereinafter, a specific example of formation of an adhesive layer on a polymer film will be described. The present invention is not so limited. Initially, a resin composition for forming an adhesive layer is dissolved in a solvent to obtain a resin solution which is in turn applied to a surface of a polymer film, followed by drying. Alternatively, the thus-obtained resin solution may be cast onto a support, followed by removal of a solvent, and a resultant sheet maybe adhered onto a polymer film. In either method, the adhesive layer may be formed after a conductor layer is already formed on one surface of the polymer film, or the adhesive layer may be formed before the formation of the conductor layer. When the thermosetting resin contains a thermoplastic polyimide and a thermosetting component (e.g., epoxy), the thermoplastic polyimide is a solvent-soluble resin.

A protection film may be used for the purpose of protecting a surface of the multilayer structure of the present invention.

The multilayer structure of the present invention obtained as described above has satisfactory adhesiveness between the conductor layer and the polymer film, and is useful as a member for a multilayer wiring board. A multilayer wiring board using the same has stable adhesiveness between the conductor and the polymer film and excellent heat resistance, and can be applied to applications requiring a narrow pitch wiring pattern, a small-diameter via, and the like.

Next, an example of production of a multilayer wiring board using the multilayer structure of the present invention will be described. (i) Initially, a double-sided circuit substrate made of polyimide film having a first layer circuit on both sides thereof is prepared. (ii) The multilayer structure of the present invention is adhered to the substrate by thermal lamination or hot pressing. Conditions for this situation are appropriately set depending on the type of the adhesive layer. When the conductor layer is copper foil, the temperature is preferably no more than 300° C. for suppression of degradation due to oxidation. The thus-obtained double-sided circuit substrate having a multilayer structure adhered thereto is herein referred to as a shield plate for a multilayer wiring board, or a shield plate.

As a method of using the obtained shield plate to produce a multilayer wiring board, (iii) a via hole is-formed in the conductor layer of the shield plate, where the via hole is located immediately above a land of the first layer circuit. Examples of a method for forming the via hole include various methods, such as by laser, plasma etching, and chemical etching. (iv) The shape of the via hole is optionally adjusted by desmear treatment or the like after the formation of the via hole. (v) Thereafter, a conductive paste is buried in the via hole, followed by plating or the like, thereby causing the via hole to be conductive. Thereafter, (vi) the conductor layer in the multilayer structure of the present invention is subjected to patterning and then etching to form a new circuit, thereby obtaining a four-layer circuit substrate. Further, if necessary, the steps of producing the multilayer circuit substrate shield plate in steps (i) and (ii) and forming a circuit in steps (iii) to (vi) are repeated a required number of times, thereby making it possible to obtain the multilayer structure of the present invention and a multilayer wiring board using the same.

As described above, the multilayer structure of the present invention and a multilayer wiring board using the multilayer structure of the present invention are described. The present invention is not so limited. The present invention may be implemented in embodiments having improvements, modifications, and variations based on the knowledge of those skilled in the art without departing from the scope and spirit of the present invention.

EXAMPLES

Hereinafter, the present invention will be specifically described by way of examples. The present invention is not limited only to the examples below.

In the examples, ODA represents 4,4'-diaminodiphenylether, p-PDA represents paraphenylenediamine, BAPS-M represents bis(4-(3-aminophenoxy)phenyl)sulfone, PMDA represents pyromellitic dianhydride, TMHQ represents p-phenylenebis (trimellitic acid monoester anhydride), ESDA represents 2,2-bis(4-hydroxyphenyl)propanebenzoate-3,3',4,4'-tetracarboxylic dianhydride, DMF represents N,N-dimethylformamide, and HAB represents 3,3'-dihydroxy-4,4'-diaminobiphenyl.

Properties of polymer films were measured as follows.

(Coefficient of Linear Expansion)

A polymer film was subjected to alternating heating and cooling at an increasing and deceasing temperature rate of 10°C./min from room temperature to 400° C. in the presence of nitrogen gas flow. The average coefficient of linear expansion was measured in the range of 100 to 200° C. during the second increasing of the temperature. As a measurement device, TMA8140 manufactured by Rikagaku Corporation was used.

(Modulus of Tensile Elasticity)

A modulus of tensile elasticity was measured in accordance with a method of ASTM D882.

(Water Absorption Ratio)

Measurement was performed in accordance with ASTM D-570. Specifically, assuming the weight of a film which was dried at 150° C. for 30 minutes is represented by $W_1$, and the weight of the film which was immersed in distilled water for 24 hours and then whose surface was wiped free of water drops is represented by $W_2$, the water absorption ratio is calculated by:

$$\text{Water absorption ratio (\%)} = (W_2-W_1)/W_1 \times 100.$$

(Initial Adhesive Strength Between a Conductor Layer and a Film)

Initial adhesive strength was measured in accordance with JIS C 6481.

(Surface Flatness)

A thin line pattern (L/S=100/100 and L number=10, where L/S is an abbreviation of Line and Space, Line represents the width of a circuit, and Space represents a width (or gap) between circuits) is formed on a FR-4 substrate having a copper foil with a thickness of 25 μm (epoxy resin-impregnated glass cloth). On the resultant substrate, a multilayer structure comprising a conductor layer, an adhesive layer, and a polymer film is superimposed, where the thin line pattern and the adhesive layer of the multilayer structure face each other, followed by pressing at 200° C. at 3 MPa for 2 hours by using a pressing apparatus, resulting in a new multilayer structure. The surface shape of the conductor layer of the resultant multilayer structure was measured by a surface roughness measuring machine (surface shape measuring machine manufactured by Nippon Shinku Gijyutsu; Dektakk3030).

(Adhesive Strength of Rear Surface Adhesive)

The adhesive layer on the rear surface was caused to face the matte surface of a rolled copper foil (Nikko Materials co. LTD), followed by lamination pressing (200° C., 3 MPa, 2 hours). The adhesive strength of the resultant sample was measured in accordance with JIS C 6481.

(Dielectric Loss Tangent)

The dielectric loss tangent of the obtained heat resistant polyimide film was measured at 12.5 GHz by a molecular orientation analyzer (MOA-2012A) manufactured by Oji Scientific Instruments.

(Dielectric Breakdown Voltage)

Measurement was performed at a frequency of 60 Hz at 20° C. in accordance with ASTM D149.

Example 1

(1) DMF and p-PDA having an equivalent weight of 1 and ODA having an equivalent weight of 1 were added to a separable flask, followed by stirring well at room temperature until the diamine compound was completely dissolved. Thereafter, the mixture was cooled on ice. TMHQ having an equivalent weight of 1 was added to the mixture, followed by stirring for 40 minutes while cooling. Thereafter, PMDA having an equivalent weight of 1 was dissolved in DMF, and was gradually added to the mixture, followed by stirring for 1 hour while cooling, to obtain a DMF solution of poly(amic acid). It should be noted that the amount of DMF used was equivalent to a monomer feed concentration of 18% by weight of the diamino compound and the aromatic tetracarboxylic acid compound.

10 g of acetic anhydride and 10 g of isoquinoline were added to 100 g of the above-described poly(amic acid) solution, followed by uniformly stirring. Thereafter, defoaming was performed. The mixture was flow-cast on a glass plate, followed by drying at about 100° C. for 10 minutes. Thereafter, a poly(amic acid) coating film was peeled off the glass plate. Thus, a gel film having self supporting capability was obtained. The coating film was fixed on a supporting frame, followed by heating at 200° C. for about 10 minutes, at about 300° C. for about 10 minutes, at about 400° C. for about 10 minutes, and at about 500° C. for about 10 minutes, and ring-closing dehydration by drying, resulting in a polyimide film having a thickness of about 25 μm. The resultant polyimide film had a modulus of tensile elasticity of 6 GPa, a water absorption ratio of 1.2%, and a coefficient of linear expansion of $1.0 \times 10^{-5}/°$ C.

(2) The heat resistant polyimide film obtained above was attached to a substrate holder in a magnetron sputtering apparatus HSM-720 (manufactured by Shimadzu Corporation) which was in turn evacuated to $4 \times 10^{-4}$ Pa. Thereafter, Ar gas was flown into the magnetron sputtering apparatus whose pressure was held at 0.6 Pa. In this situation, a copper target was used to form a copper thin film having a thickness of 0.1 μm on one surface of the film, where a DC power source was used to apply a current of 0.5 A. It should be noted that presputtering was performed for 15 minutes before the formation of the thin film. Thereafter, electrolytic copper plating was performed by an electrolytic plating method to obtain a conductor layer having a thickness of 10 μm, where a current of 2 A was applied.

(3) DMF and BAPS-M having an equivalent weight of 1 were added to a separable flask, followed by stirring well at room temperature until BAPS-M was completely dissolved, and then cooling on ice. Thereafter, ESDA having an equivalent weight of 1 was added to the mixture, followed by stirring for 1 hour while cooling. Thus, a DMF solution of poly(amic acid) was obtained. It should be noted that the amount of DMF used was equivalent to a monomer feed concentration of 30% by weight of the diamino compound and the aromatic tetracarboxylic acid compound. 35 g of β-picoline and 60 g of acetic anhydride were added to 500 g of the poly(amic acid) solution, followed by stirring for 1 hour and then stirring at 100° C. for 1 hour, resulting in imidation. Thereafter, the solution was gradually added to methanol while stirring at high speed, thereby obtaining a filament-like polyimide resin. The polyimide resin was dried at 100° C. for 30 minutes, followed by pulverization by a mixer, Soxhlet washing using methanol, and drying at 100° C. for 2 hours, resulting in polyimide powder.

(4) 20 g of the polyimide powder obtained above, a bisphenol A-family epoxy resin, 5 g of an Epikote 828 (manufactured by Yuka Shell), and 0.015 g of 2-ethyl-4-methylimidazole as a curing accelerating agent were dissolved in 83 g of DMF. The resultant varnish was flow-cast onto a glass plate, followed by drying at 100° C. for 10 minutes. Thereafter, the resultant coating film was peeled off the glass plate, and was fixed on a support frame, followed by further drying at about 150° C. for about 20 minutes, resulting in an adhesive sheet having a thickness of 25 μm.

(5) One surface of the polymer film obtained in (2) having the conductor layer on the other surface thereof was caused to contact the adhesive sheet obtained in (4), followed by heating at a temperature of 200° C. under a pressure of 3 MPa for 20 minutes, resulting in a multilayer structure of the present invention.

Physical properties of the resultant heat resistant polyimide film (core film) and the multilayer structure are as follows:

| | |
|---|---|
| Dielectric loss tangent of the core film | 0.005 |
| Dielectric breakdown voltage | 288 kV/mm |
| Adhesive strength of the rear surface adhesive | 9 N/cm |
| Surface flatness | 1 μm or less |

Example 2

A heat resistant polyimide film having a copper thin film was obtained in the same manner as that of Examples 1(1) and (2), except that a poly(amic acid) solution flow-cast on a glass plate was dried at about 110° C. for about 5 minutes, the resultant poly(amic acid) gel film peeled off the glass plate, and was immersed in dihydroxytitaniumbislactate/1-butanol solution having a titanium concentration of 400 ppm for 10 seconds, so that excess liquid drops were removed. The resultant polyimide film had a modulus of tensile elasticity of 6 GPa, a water absorption ratio of 1.2%, and a coefficient of linear expansion of $1.0 \times 10^{-5}/°$ C.

Varnish was prepared in a similar manner to Examples 1(3) and (4) flow-cast onto a surface of the resultant polyimide film, instead of the glass plate, followed by drying at 100° C. for 10 minutes, and then at about 150° C. for about 20 minutes, thereby obtaining a multilayer structure of the present invention comprising an adhesive layer having a thickness of 25 μm. This multilayer structure had a conductor layer having an initial adhesive strength of 7 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| | |
|---|---|
| Dielectric loss tangent of the core film | 0.005 |
| Dielectric breakdown voltage | 290 kV/mm |
| Adhesive strength of the rear surface adhesive | 9 N/cm |
| Surface flatness | 1 μm or less |

Example 3

A polyimide resin and a polyimide film were obtained in the same manner as that of Example 2, and a conductor layer was formed in the same manner as that of Example 2, except that a dihydroxytitaniumbislactate/1-butanol solution having a titanium concentration of 1000 ppm was used. The resultant polyimide film had a modulus of tensile elasticity of 6 GPa, a water absorption ratio of 1.2%, and a coefficient of linear expansion of $1.0 \times 10^{-5}/°$ C. The multilayer structure had a conductor layer having an initial adhesive strength of 8 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| | |
|---|---|
| Dielectric loss tangent of the core film | 0.005 |
| Dielectric breakdown voltage | 295 kV/mm |
| Adhesive strength of the rear surface adhesive | 9 N/cm |
| Surface flatness | 1 μm or less |

Example 4

A polyimide resin and a polyimide film were obtained in the same manner as that of Example 2, and a conductor layer was formed in the same manner as that of Example 2, except that a γ-aminopropyltriethoxysilane/1-butanol solution having a silicon concentration of 400 ppm was used. The resultant polyimide film had a modulus of tensile elasticity of 6 GPa, a water absorption ratio of 1.2%, and a coefficient of linear expansion of $1.0 \times 10^{-5}$/°C. The multilayer structure had a conductor layer having an initial adhesive strength of 10 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| | |
|---|---|
| Dielectric loss tangent of the core film | 0.005 |
| Dielectric breakdown voltage | 287 kV/mm |
| Adhesive strength of the rear surface adhesive | 9 N/cm |
| Surface flatness | 1 μm or less |

Example 5

A polyimide resin and a polyimide film were obtained in the same manner as that of Example 2, and a conductor layer was formed in the same manner as that of Example 2, except that a γ-aminopropyltriethoxysilane/1-butanol solution having a silicon concentration of 1000 ppm was used, and a multilayer structure of the present invention having an adhesive layer having a thickness of 25 μm was obtained. The resultant polyimide film had a modulus of tensile elasticity of 6 GPa, and a water absorption ratio of 1.2%, and a coefficient of linear expansion of $1.0 \times 10^{-5}$/°C. The multilayer structure had a conductor layer having an initial adhesive strength of 13 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| | |
|---|---|
| Dielectric loss tangent of the core film | 0.005 |
| Dielectric breakdown voltage | 280 kV/mm |
| Adhesive strength of the rear surface adhesive | 9 N/cm |
| Surface flatness | 1 μm or less |

Example 6

DMF and DABA having an equivalent weight of 1 and ODA having an equivalent weight of 1 were added to a separable flask, followed by stirring well at room temperature until the diamine compound was completely dissolved. Thereafter, the mixture was cooled on ice. TMHQ having an equivalent weight of 2 was added to the mixture, followed by stirring for 1 hour while cooling. Thereby, a DMF solution of poly(amic acid) was obtained. It should be noted that the amount of DMF used was equivalent to a monomer feed concentration of 18% by weight of the diamino compound and the aromatic tetracarboxylic acid compound.

Similar to Example 2, a conductor layer was formed from the poly(amic acid), and a multilayer structure of the present invention having an adhesive layer having a thickness of 25 μm was obtained. The resultant polyimide film had a modulus of tensile elasticity of 10 GPa, a water absorption ratio of 0.8%, and a coefficient of linear expansion of $0.6 \times 10^{-5}$/°C. The multilayer structure had a conductor layer having an initial adhesive strength of 7 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| | |
|---|---|
| Dielectric loss tangent of the core film | 0.005 |
| Dielectric breakdown voltage | 295 kV/mm |
| Adhesive strength of the rear surface adhesive | 9 N/cm |
| Surface flatness | 1 μm or less |

Example 7

The poly(amic acid) obtained in Example 6 and a dihydroxytitaniumbislactate/1-butanol solution having a titanium concentration of 1000 ppm were used to produce a polyimide resin and a polyimide film in a similar manner to Example 3, and a conductor layer was formed. Further, a multilayer structure of the present invention having an adhesive layer having a thickness of 25 μm was obtained. The resultant polyimide film had a modulus of tensile elasticity of 10 GPa, a water absorption ratio of 0.8%, and a coefficient of linear expansion of $0.6 \times 10^{-5}$/°C. The multilayer structure had a conductor layer having an initial adhesive strength of 7 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| Dielectric loss tangent of the core film | 0.005 |
|---|---|
| Dielectric breakdown voltage | 285 kV/mm |
| Adhesive strength of the rear surface adhesive | 9 N/cm |
| Surface flatness | 1 μm or less |

Example 8

The poly(amic acid) obtained in Example 6 and a γ-aminopropyltriethoxysilane/1-butanol solution having a silicon concentration of 400 ppm were used to produce a polyimide resin and a polyimide film in a similar manner to Example 4, and a conductor layer was formed. Further, a multilayer structure of the present invention having an adhesive layer having a thickness of 25 μm was obtained. The resultant polyimide film had a modulus of tensile elasticity of 10 GPa, a water absorption ratio of 0.8%, and a coefficient of linear expansion of $0.6 \times 10^{-5}/°$ C. The multilayer structure had a conductor layer having an initial adhesive strength of 11 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| Dielectric loss tangent of the core film | 0.005 |
|---|---|
| Dielectric breakdown voltage | 290 kV/mm |
| Adhesive strength of the rear surface adhesive | 9 N/cm |
| Surface flatness | 1 μm or less |

Example 9

The poly(amic acid) obtained in Example 6 and a γ-aminopropyltriethoxysilane/1-butanol solution having a silicon concentration of 1000 ppm were used to produce a polyimide resin and a polyimide film in a similar manner to Example 5, and a conductor layer was formed. Further, a multilayer structure of the present invention having an adhesive layer having a thickness of 25 μm was obtained. The resultant polyimide film had a modulus of tensile elasticity of 10 GPa, a water absorption ratio of 0.8%, and a coefficient of linear expansion of $0.6 \times 10^{-5}/°$ C. The multilayer structure had a conductor layer having an initial adhesive strength of 14 N/cm, and a satisfactory adhesive strength to a conductor, and is suitable as a material for a multilayer wiring board. Further, the thus-obtained multilayer structure was superimposed on the opposite surfaces of a circuit substrate having a circuit pattern on the opposite surfaces of a polyimide film thereof, where each adhesive layer thereof faces the circuit pattern surface, followed by lamination using a pressing apparatus where conditions for pressing were 200° C., 3 MPa, and 2 hours. Thereby, a shield plate for a multilayer wiring board was produced. This shield plate was used to produce a four-layer wiring board. In this case, a conductor layer was not peeled off.

Physical properties of the resultant heat resistant polyimide film (core film) and the multilayer structure are as follows:

| Dielectric loss tangent of the core film | 0.005 |
|---|---|
| Dielectric breakdown voltage | 291 kV/mm |
| Adhesive strength of the rear surface adhesive | 9 N/cm |
| Surface flatness | 1 μm or less |

Example 10

(1) A heat resistant polyimide film having a copper thin film was obtained in the same manner as that of Example 2, except that the thickness of the film was 12.5 μm. It should be noted that the obtained polyimide film had a modulus of tensile elasticity of 6 GPa, a water absorption ratio of 1.2%, a coefficient of linear expansion of $1.0 \times 10^{-5}/°$ C., a dielectric loss tangent of 0.005, and a dielectric breakdown voltage of 301 kV/mm. The adhesive strength of the copper thin film was 7 N/cm.

(2) Polyimide powder was obtained in the same manner as that of Example 1(3), except that APB having an equivalent weight of 0.95 and HAB having an equivalent weight of 0.05 were used instead of BAPS-M.

(3) The thus-obtained polyimide powder, novolac epoxy resin (Epikote 1032H60: manufactured by Yuka Shell), and 4,4-diaminophenylsulfone (hereinafter referred to as 4,4-DDS) as a curing agent were separately dissolved in dioxolan, thereby obtaining solutions having a concentration of 10% by weight. These obtained solutions were mixed together so that a weight ratio of polyimide, epoxy resin, and 4,4'-DDS was 70:30:9, thereby obtaining an adhesive solution.

(4) The adhesive solution obtained in (3) above was flow-cast onto the heat resistant polyimide film having the copper thin film obtained in (1) above, followed by drying at 170° C. for 2 minutes, thereby obtaining a multilayer structure of the present invention having an adhesive layer with a thickness of 12.5 μm. The adhesive strength of the rear surface adhesive was 9 N/cm, and the surface flatness was 2 μm.

Example 11

A multilayer structure was obtained in the same manner as that of Example 10, except that urethane modified epoxy resin (EPU-73: manufactured by Asahi Denka) was used in addition to the polyimide powder obtained in Example 10(3), the novolac epoxy resin, and 4,4'-DDS, and the polyimide, Epikote 1032H60, EPU-73, and 4,4'-DDS were mixed at a weight ratio of 50:30:20:10. The adhesive strength of the rear surface adhesive was 10 N/cm. The surface flatness was 1 μm. It should be noted that the obtained polyimide film has a modulus of tensile elasticity of 6 GPa, a water absorption ratio of 1.2%, a coefficient of linear expansion of $1.0 \times 10^{-5}/°$ C., a dielectric loss tangent of 0.005, and a dielectric breakdown voltage of 301 kV/mm. The adhesive strength of the copper thin film was 7 N/cm.

Comparative Example 1

A multilayer structure was obtained in the same manner as that of Example 2, except that a gel film was immersed in a dihydroxytitaniumbislactate/1-butanol solution having a titanium concentration of 400 ppm for 10 seconds, and a step of removing excess liquid drops was not performed. The conductor layer of the multilayer structure had an initial adhesive strength of 2 N/cm. When the multilayer structure was used to produce a four-layer wiring board similar to Example 1, peeling of the conductor layer occurred.

INDUSTRIAL APPLICABILITY

The multilayer structure of the present invention can be widely used for production of a multilayer printed wiring board. The multilayer structure can be used to provide a multilayer printed wiring board having high heat resistance, a narrow pitch wiring pattern, a small-diameter via, uniform insulating layer thickness, and an appropriately low coefficient of linear expansion.

The multilayer structure of the present invention can be widely used for production of a multilayer wiring board. The multilayer structure can be used to provide a multilayer wiring board having high heat resistance, a narrow pitch wiring pattern, a small-diameter via, uniform insulating layer thickness, an appropriately low coefficient of linear expansion, and stable adhesive strength to a conductor.

The multilayer structure of the present invention is described as above. The present invention is not so limited. The present invention may be implemented in embodiments having improvements, modifications, and variations based on the knowledge of those skilled in the art without departing from the scope and spirit of the present invention.

The invention claimed is:

1. A multilayer structure for use in a multilayer wiring board produced by a build-up method, comprising a conductor layer, an adhesive layer, and a polymer film layer interposed between the conductor layer and the adhesive layer, wherein the polymer film layer has a modulus of tensile elasticity of at least 5 GPa, a coefficient of linear expansion of no more than $2.0 \times 10^{-5}/°$ C., and a water absorption ratio of no more than 1.5%, and wherein the adhesive layer includes a resin composition containing a thermosetting resin and thermoplastic polyimide.

2. A multilayer structure according to claim 1, wherein the dielectric loss tangent of the polymer film layer is no more than 0.01.

3. A multilayer structure according to claim 1, wherein the dielectric breakdown voltage of the polymer film layer is at least 200 kV.

4. A multilayer structure according to claim 1, wherein the polymer film layer contains an element selected from the group consisting of Al, Si, Ti, Mn, Fe, Co, Cu, Zn, Sn, Sb, Pb and Bi.

5. A multilayer structure according to claim 1, wherein the resin composition contains a thermoplastic polyimide and a thermosetting resin at a ratio of 95:5 to 10:90.

6. A multilayer structure according to claim 5, wherein the thermoplastic polyimide is a soluble polyimide.

7. A multilayer structure according to claim 5, wherein the thermoplastic polyimide is a polyimide made of a substance selected from the group consisting of ESDA (2,2-bis(4-hydroxyphenyl)propanedibenzoate-3,3',4,4'-tetracarboxylic dianhydride) and TMEG (3,3',4,4'-ethyleneglycoldibenzoate-tetracarboxylic dianhydride).

8. A multilayer structure according to claim 5, wherein the thermoplastic polyimide is a polyimide made of a substance selected from the group consisting of APB (1,3-bis(3-aminophenoxy)benzene) and BAPS-M (bis(4-(3-aminophenoxy)phenyl)sulfone).

9. A multilayer structure according to claim 5 wherein the thermoplastic polyimide is a polyimide having a functional group selected from the group consisting of a hydroxyl group and a carboxyl group.

10. A multilayer structure according to claim 1, wherein the adhesive layer has a thickness 0.5 to 2.0 times the thickness of an inner layer circuit.

11. A multilayer structure according to claim 1, wherein the conductor layer and the polymer film layer are adhered together with an initial adhesive strength of at least 7 N/cm in a peel test of 50 mm/min in a 90-degree direction.

12. A multilayer structure according to claim 1, wherein the polymer film layer and the adhesive layer are adhered together with an initial adhesive strength of at least 7 N/cm in a peel test of 50 mm/min in a 90-degree direction.

13. A multilayer structure according to claim 1, wherein the conductor layer is a metal conductor layer formed directly on the polymer film layer.

14. A multilayer wiring board, comprising a multilayer structure according to claim 1.

15. A multilayer structure according to claim 1, wherein the polymer film layer is a polyimide film.

16. A multilayer structure according to claim 15, wherein the polyimide film is an aromatic polyimide film.

17. A multilayer structure according to claim 15, wherein the polyimide film is a polyimide film made of an acid anhydride selected from the group consisting of PMDA (pyromellitic dianhydride), BPDA (biphenyltetracarboxylic dianhydride), BTDA (benzophenonetetracarboxylic dianhydride), TMHQ (p-phenylenebis(trimellitic acid monoester anhydride)), and ESDA (2,2-bis(9-hydroxyphenyl)propanedibenzoate-3,3',4,4'-tetracarboxylic dianhydride).

18. A multilayer structure according to claim 15, wherein the polyimide film is a polyimide film made of a diamine component selected from the group consisting of diaminodiphenylether, paraphenylenediamine, and DABA (dibenzanilide).

19. A multilayer structure according to claim 1, wherein the polymer film layer is a polyimide film containing at least one repeating unit represented by the following formula (1) in the molecule:

(1)

where $R^1$ and R each represents a bivalent organic group.

20. A multilayer structure according to claim 19, wherein $R^1$ is a bivalent organic group selected from the group consisting of the following:

,

-continued where $R^4$ represents $CH_3-$, $Cl-$, $Br-$, $F-$ or $CH_3O-$; and R represents the following:

where n represents an integer of 1 to 3, X represents a monovalent substituent selected from the group consisting of hydrogen, halogen, carboxyl groups, lower alkyl groups having no more than 6 carbon atoms, and lower alkoxy groups having no more than 6 carbon atoms; and bivalent organic groups represented by where Y and Z independently represent a monovalent substituent selected from the group consisting of hydrogen, halogen, carboxyl groups, lower alkyl groups having no more than 6 carbon atoms, and lower alkoxy groups having no more than 6 carbon atoms, A represents a bivalent linking group selected from the group consisting of —O—, —S—, —CO—, —CONH—, —SO—, —SO$_2$—, —CH$_2$—, —NHCO—, and (CH$_3$)$_2$—, and A is preferably —O—.

21. A multilayer structure according to claim 20, wherein the polyimide film further contains a repeating unit represented by the following formula (2):

(2)

where R is the same as R in the above-described formula (1), $R^3$ represents a tetravalent organic group selected from the group consisting of the following:

and

22. A multilayer structure according to claim 19, wherein the polymer film layer is a polyimide film containing a repeating unit represented by the following formula (3) in the molecule:

(3)

where R is the same as the R in the above-described formula (1).

23. A multilayer structure according to claim 19, wherein the polymer film layer is a polyimide film containing a repeating unit represented by the following formula (4) and another repeating unit represented by the following formula (5):

(4)

where $R^2$ represents a bivalent organic group selected from the group consisting of:

(5)

where $R^2$ is the same as the $R^2$ in the above-described formula (4), and $R^3$ represents a tetravalent organic group selected from the group consisting of the following:

24. A multilayer structure according to claim 1, wherein the polymer film layer is a polyimide containing a repeating unit selected from the group consisting of repeating units represented by the following formulas (6) to (9) in the molecule:

(6)

(7)

-continued and

25. A multilayer structure according to claim 24, wherein the polymer film layer contains the repeating units represented by formulas (6) to (9), and assuming that the number of the repeating units represented by formulae (6) to (9) are represented by a, b, c and d, respectively, and a+b+c+d=s, all values of (a+b)/s, (a+c)/s, (b+d)/s, and (c+d)/s fall within the range of 0.25 to 0.75.

26. A multilayer structure according to claim 1, wherein the polymer film layer contains an imide repeating unit made of TMHQ and DABA and an imide repeating unit made of TMHQ and ODA at a predetermined ratio, and the predetermined ratio of the number of the repeating units made of TMHQ and DABA to the number of the repeating units made of TMHQ and ODA is in the range of 80:20 to 20:80.

* * * * *